United States Patent
Ehwald et al.

(10) Patent No.: US 7,307,336 B2
(45) Date of Patent: Dec. 11, 2007

(54) BICMOS STRUCTURE, METHOD FOR PRODUCING THE SAME AND BIPOLAR TRANSISTOR FOR A BICMOS STRUCTURE

(75) Inventors: Karl-Ernst Ehwald, Frankfurt (DE); Alexander Fox, Frankfurt (DE); Dieter Knoll, Frankfurt (DE); Bernd Heinemann, Frankfurt (DE); Steffen Marschmayer, Frankfurt (DE); Katrin Blum, Frankfurt (DE)

(73) Assignee: IHP GmbH - Innovations for High Performance Microelectronic / Institut fur innovative Mikroelektronik, Berlin (DE)

( * ) Notice: Subject to any disclaimer, the term of this patent is extended or adjusted under 35 U.S.C. 154(b) by 287 days.

(21) Appl. No.: 10/497,827

(22) PCT Filed: Dec. 6, 2002

(86) PCT No.: PCT/EP02/13858

§ 371 (c)(1),
(2), (4) Date: Jun. 4, 2004

(87) PCT Pub. No.: WO03/049191

PCT Pub. Date: Jun. 12, 2003

(65) Prior Publication Data

US 2005/0006724 A1  Jan. 13, 2005

(30) Foreign Application Priority Data

Dec. 6, 2001  (DE) ................ 101 62 074

(51) Int. Cl.
*H01L 27/102* (2006.01)
(52) U.S. Cl. ...................... 257/565; 257/584
(58) Field of Classification Search ............ None
See application file for complete search history.

(56) References Cited

U.S. PATENT DOCUMENTS

| | | | |
|---|---|---|---|
| 5,001,533 | A | 3/1991 | Yamaguchi |
| 5,391,503 | A | 2/1995 | Miwa et al. |
| 5,523,245 | A | 6/1996 | Imai |
| 5,587,599 | A | 12/1996 | Mahnkopf et al. |
| 5,773,350 | A | 6/1998 | Herbert et al. |
| 5,897,359 | A | 4/1999 | Cho et al. |

FOREIGN PATENT DOCUMENTS

| | | |
|---|---|---|
| EP | 0 500 233 A2 | 8/1992 |
| EP | 05062991 | 12/1993 |
| EP | 0 768 716 A2 | 4/1997 |
| EP | 0768716 A2 * | 4/1997 |
| EP | 1 117 133 A1 | 7/2001 |
| WO | WO 03/100845 | 12/2003 |

* cited by examiner

OTHER PUBLICATIONS

"Trends in Silicon Germanium BICMOS Integration and Reliability" by J. Dunn; Reliability Physics Symposium, 2000. Proceedings. 38th Annual 2000 IEEE International, pp. 237-242, Apr. 10-13, 2000.

*Primary Examiner*—Kiesha Rose
(74) *Attorney, Agent, or Firm*—Ware, Fressola, Van Der Sluys & Adolphson LLP

(57) ABSTRACT

The invention concerns a bipolar transistor with an epitaxially grown base and a self-positioned emitter, whereby the base is formed from a first substantially monocrystalline epitaxial region (1) which is arranged in parallel relationship to the surface of the semiconductor substrate (2) and a second substantially polycrystalline and highly doped region (3) of the same conductivity type which is arranged in perpendicular relationship to the substrate surface and encloses the first region at all sides and that said second region, at least at one side but preferably at all four sides, is conductingly connected to a third, preferably highly doped or metallically conducting, high temperature-resistant polycrystalline layer (4) which is arranged in parallel relationship to the surface of the semiconductor substrate and forms or includes the outer base contact to a metallic conductor track system.

7 Claims, 3 Drawing Sheets

BICMOS STRUCTURE, METHOD FOR PRODUCING THE SAME AND BIPOLAR TRANSISTOR FOR A BICMOS STRUCTURE

CROSS REFERENCE TO RELATED APPLICATIONS

This application is for entry into the U.S. national phase under §371 for International Application No. PCT/EP02/13858 having an international filing date of Dec. 6, 2002, and from which priority is claimed under all applicable sections of Title 35 of the United States Code including, but not limited to, Sections 120, 363 and 365(c), and which in turn claims priority under 35 USC §119 to German Patent Application No. 101 62 074.8 filed on Dec. 6, 2001.

TECHNICAL FIELD

The invention concerns a process for the production of a BiCMOS structure and a BiCMOS structure, as well as a bipolar transistor which is suitable for integration into a BiCMOS structure.

BACKGROUND ART

The object of the invention is to provide an improved process for the production of a BiCMOS structure. A further object is to provide an improved BiCMOS structure and in particular an improved bipolar transistor suitable for integration into a BiCMOS structure.

DISCLOSURE OF THE INVENTION

The first object is attained by a process provided by the invention, and the second object is attained by a bipolar transistor also provided by the invention.

The process according to the invention for the production of a BiCMOS structure includes a CMOS standard process which includes the deposition of a gate insulating layer and a gate layer on the substrate where the CMOS structure is to occur. It also includes the production of a bipolar transistor. The process according to the invention is distinguished in that the gate insulating layer and the gate layer are also deposited on the substrate where the bipolar transistor is to occur.

In the finished BiCMOS structure the gate layer serves as a highly doped or metallically conducting base contact region for bipolar transistors for connection of the base to a conductor track system and in addition as a gate for MOS transistors. It can be in the form of a polycrystalline or amorphous gate layer.

In accordance with a configuration of the invention at least one auxiliary layer is deposited over the gate layer. Production of the bipolar transistor is then effected by means of the at least one auxiliary layer. It is also possible to deposit a plurality of auxiliary layers which include one or more auxiliary insulating layers and the total thickness of which approximately corresponds to the thickness of the gate layer. The term auxiliary layers is used to denote layers which are helpful in the production of the BiCMOS structure but which have no particular function in the finished BiCMOS structure or are removed. In particular a first auxiliary insulating layer, a conductive auxiliary layer and a second auxiliary insulating layer can be deposited in succession as the auxiliary layers, in which respect an $Si_3N_4$ layer can be deposited as the uppermost auxiliary insulating layer. The auxiliary insulating layers serve in later etching steps as etching stop layers, for preventing etching of the regions covered by the etching stop layers. The conductive auxiliary layer which can include polycrystalline or amorphous silicon serves in a later etching step for the production of spacers to ensure a step height which is sufficient for producing the spacers.

In accordance with a further configuration at least one window with almost vertical side walls is etched into the at least one auxiliary layer, the gate layer and the gate insulating layer, in order to expose the substrate surface. A base layer is then deposited. Prior to deposition of the base layer, a buffer layer can be deposited as a seed layer for the base layer.

In a further configuration a base layer is deposited with a monocrystalline base region and a polycrystalline base region, wherein the polycrystalline base region is formed at least at the side walls of the window and the monocrystalline base region is formed on the substrate surface.

Deposition of the base can be effected by means of differential or selective epitaxy. In differential epitaxy, the base layer grows over monocrystalline silicon regions such as for example the substrate in monocrystalline form and over other regions, for example polycrystalline regions, amorphous regions or insulating regions, it is in polycrystalline or amorphous form. In selective epitaxy in contrast the base layer grows only over silicon regions (monocrystalline, polycrystalline or amorphous), but not over insulating regions.

The base can be doped in situ, that is to say during the deposition procedure, in which case, at the end of the deposition process, deposition of the base can be effected in particular with a lower level of doping substance concentration or without doping substance in order to produce a weakly doped layer, also referred to as a cap layer, as the uppermost base layer.

In accordance with a further configuration, in particular a layer stack comprising a layer sequence of silicon layer, silicon-germanium layer and silicon layer, can be deposited as the base. The silicon-germanium layer and/or at least one of the silicon layers may also contain carbon.

In accordance with still a further configuration of the process according to the invention, a mask is applied prior to etching of the gate layer and the at least one auxiliary layer. Etching of the gate layer and the at least one auxiliary layer is effected by means of reactive ion etching, the gate insulating layer being used as an etching stop layer.

In particular the gate insulating layer can be etched by a wet-chemical process after etching of the gate layer and the auxiliary layer, in order to expose the substrate surface.

In accordance with still a further configuration of the invention the polycrystalline base region has an almost perpendicular portion at which at least one spacer is produced. To produce the at least one spacer, a layer combination including an $SiO_2$ layer, an $Si_3N_4$ layer and a conductive spacer layer can be deposited and the layer combination can then be etched in such a way that the at least one spacer is formed.

In a further configuration of the process according to the invention, after production of the at least one layer, an emitter layer is deposited, from which at least the emitter of a bipolar transistor is produced. In particular the emitter can be of a polycrystalline, amorphous or partially monocrystalline nature. A partially monocrystalline emitter involves an emitter which has a monocrystalline as well as a polycrystalline or amorphous region. The monocrystalline region is arranged between the polycrystalline or amorphous region.

To deposit the emitter, there can be a plurality of auxiliary layers, the uppermost auxiliary layer being an auxiliary insulating layer. Portions of the polycrystalline base region are then deposited over the auxiliary insulating layer and the emitter layer and those portions of the polycrystalline base region which are over the auxiliary insulating layer are etched away to produce the emitter, the auxiliary insulating layer being used as an etching stop layer.

After production of the emitter the at least one auxiliary layer is preferably removed. If the at least one auxiliary layer includes only auxiliary insulating layers, then after etching of the emitter layer and those portions of the polycrystalline base region which are over the uppermost auxiliary insulating layer, the auxiliary layer is removed in a mask-less etching step. If in contrast the at least one auxiliary layer includes at least two auxiliary insulating layers and a conductive auxiliary layer, then after production of the emitter, all auxiliary insulating layers which are over the conductive auxiliary layer are removed in a first mask-less etching step. The conductive auxiliary layer is then removed in a masked etching step, the emitter being covered by a mask. Thereafter all auxiliary insulating layers which are under the conductive auxiliary layer are removed in a second mask-less etching step.

In accordance with a further configuration all further following process steps are identical to CMOS processes for the sole production of CMOS structures.

The bipolar transistor provided by the invention, and in particular for use in a BiCMOS structure, includes an emitter and a base, wherein the base includes a monocrystalline base region and a polycrystalline base region. It is distinguished in that the emitter is laterally surrounded at least partially by a base contact layer which is laterally separated from the emitter by at least one spacer and the polycrystalline base region is disposed between the at least one spacer and the base contact region. In that case the at least one spacer may include one or more insulator layers.

In accordance with a configuration of the invention the at least one spacer includes a conductive spacer layer which is arranged between the emitter and at least one insulating layer of the at least one spacer in such a way that it is electrically conductingly connected to the emitter.

Alternative processes and bipolar transistor embodiments are provided by the invention, distinguished by one or more of the following features (explained using reference labels appearing in drawings described below).

1. A bipolar transistor with epitaxially grown base and self-positioned emitter, characterized in that the base is formed from a first substantially monocrystalline epitaxial region (1) which is arranged in parallel relationship to the surface of the semiconductor substrate (2) and a second substantially polycrystalline and highly doped region (3) of the same conductivity type which is arranged in perpendicular relationship to the substrate surface and encloses the first region at all sides and that said second region, at least at one side but preferably at all four sides, is conductingly connected to a third, preferably highly doped or metallically conducting, high temperature-resistant polycrystalline layer (4) which is arranged in parallel relationship to the surface of the semiconductor substrate and forms or includes the outer base contact to a metallic conductor track system.

2. A bipolar transistor with epitaxially grown base and self-positioned emitter as set forth in 1 characterized in that the spacing between the self-positioned active emitter (5) and the highly doped polycrystalline region (3) arranged in perpendicular relationship to the surface of the semiconductor substrate (2) is defined by spacers (3a) arranged at the perpendicular region and comprising one or more layers deposited by a CVD process.

3. A bipolar transistor with epitaxially grown base and self-positioned emitter as set forth in 1 and 2 characterized in that the spacer (3a) comprises one or more insulating layers.

4. A bipolar transistor with epitaxially grown base and self-positioned emitter as set forth in 1 and 2 characterized in that the spacer (3a) comprises a combination of one or more insulating layers and at least one high temperature-resistant, good-conducting polycrystalline layer (6), wherein the latter is conductingly connected to the active emitter.

5. A bipolar transistor with epitaxially grown base and self-positioned emitter as set forth in 1 characterized in that the monocrystalline epitaxial region (1) of the base is delimited laterally, preferably at at least three sides, by an insulating region (7), for example a shallow trench or field oxide.

6. A process for the production of a bipolar transistor as set forth in one of features 1–5 characterized in that in the integration of the bipolar transistor in a production process for CMOS circuits after the production of a thin gate insulator or an insulator (4a) deposition of the polycrystalline layer (4) is effected with the same process with which the polycrystalline gate of MOS transistors is deposited on the same semiconductor substrate at other locations.

7. A process for the production of a bipolar transistor as set forth in one of features 1–5 characterized in that after deposition of the polycrystalline layer (4) one or more insulating layers is or are deposited over same, the total thickness thereof being comparable to the thickness of the polycrystalline layer (4), and wherein the uppermost one of said layers (7b) preferably comprises $Si_3N_4$.

8. A process for the production of a bipolar transistor as set forth in one of features 1–5 characterized in that after deposition of the polycrystalline layer (4) a thin insulator (7a), a polycrystalline layer (8) and a further insulator (7b) are successively deposited, wherein the total thickness of the layer stack (7a), (8), (7b) is comparable to the thickness of the polycrystalline layer (4) and wherein the uppermost one of said layers (7b) preferably comprises $Si_3N_4$.

9. A process for the production of a bipolar transistor as set forth in one of features 1–5 and feature 7 or one of features 1–5 and feature 8 characterized in that after deposition of a layer or layer sequence over the polycrystalline layer (4) as set forth in feature 7 or 8 a lacquer mask is produced and then by means of RIE (reactive ion etching) windows (referred to hereinafter as bipolar windows) with an almost vertical slope are etched into the layer or layer sequence deposited over the polycrystalline layer (4) and thereafter into the polycrystalline layer (4) itself, then the thin gate insulator or insulator (4a) is removed preferably by wet-chemical etching and thereafter, preferably after deposition of a buffer layer (1b) as a seed layer and part of the collector, the monocrystalline region (1) and the polycrystalline region (3) arranged in perpendicular relationship to the substrate surface, of an in situ-doped base, is deposited with differential or selective epitaxy, wherein preferably the last part of the deposition procedure is implemented without or with a greatly reduced level of doping concentration (deposition of a so-called "cap layer").

10. A process for the production of a bipolar transistor as set forth in one of features 1–5 and feature 9 characterized in that after deposition of the monocrystalline and polycrystalline regions of the base (3) and (4) in succession, preferably by means of CVD processes, an SiO$_2$ layer but preferably a layer combination of SiO$_2$ (9) and Si$_3$N$_4$ (10) and a conductive polycrystalline layer (6), preferably of in situ-doped polysilicon, are deposited by means of CVD processes and then by means of RIE or a combination of RIE and wet-chemical etching said layers are removed again with the exception of the region of the spacers (3a).

11. A process for the production of a bipolar transistor as set forth in one of features 1–5 and feature 10 characterized in that after production of the spacers (3a) a polycrystalline or partially monocrystalline emitter (5) is deposited, for example comprising in situ-doped polysilicon, and that thereafter by means of CMP processes (chemical-mechanical polishing) the polycrystalline emitter layer (5) and the parts, deposited over the insulating layer (7b), of the polycrystalline region (3) of the base are removed, the insulating layer (7b) serving as an etching stop layer.

12. A process for the production of a bipolar transistor as set forth in one of features 1–5 and features 7 and 11 characterized in that the etching stop layer (7b) and optionally further insulating layers deposited over the polycrystalline layer (4) are removed by a mask-less etching process.

13. A process for the production of a bipolar transistor as set forth in one of features 1–5 and features 8 and 11 characterized in that after removal of the etching stop layer (7b) the polycrystalline layer (8) is removed by an etching process performed with a lacquer mask, wherein the lacquer mask covers the polycrystalline or partially monocrystalline emitter (5) and that thereafter the insulating layer (7a) is also removed.

14. A process for the production of a bipolar transistor as set forth in one of features 1–5 and feature 12 or feature 13 characterized in that in the further production procedure substantially the standard sequence of sub-steps for the production of CMOS circuits is used, wherein with the structuring of the polycrystalline layer (4) both the outer base connection and also the polycrystalline gates of the MOS transistors and optionally the polycrystalline circuit resistors are defined and wherein the doping of the polycrystalline layers (4) and (3) for securing a low-resistance base connection is effected jointly with the corresponding high-dose S/D implantation operation (for an npn bipolar transistor jointly with the p+S/D implantation operation) and wherein silication of the emitter (5) and the polycrystalline layers (3) and (4) is effected jointly with silication of the S/D regions of the MOS transistors.

15. A process for the production of a bipolar transistor as set forth in one of features 1–5 and feature 13 characterized in that the lacquer mask for covering the emitter (5) is also used for covering those regions of the polycrystalline layer (8), in which same is to be used as the control gate of a floating gate memory cell and that prior to production of said lacquer mask an additional insulating layer (11), preferably an SiO$_2$ layer, is deposited over the polycrystalline layer (8), either after removal of the etching stop layer (7b) or prior to the deposition thereof and that after RIE processes for structuring of the insulating layer (11), the polycrystalline layer (8) and for removal of the insulating layer (7a) said lacquer mask is removed whereafter, beginning with the deposition of a suitable anti-reflection layer and structuring of the polycrystalline layer (4), the standard sequence of sub-steps for the production of CMOS circuits follows, as set forth in feature 14, and wherein in the region of the control gates of the floating gate memory cells during the RIE process for structuring of the polycrystalline layer (4) the structured additional insulating layer (11) serves as a hard mask, by means of which self-positioning of the floating gate is made possible in relation to the previously structured control gate.

16. A process for the production of a bipolar transistor as set forth in one of features 1–5 and feature 13 characterized in that prior to removal of the etching stop layer (7b) the emitter layer (5) and the polycrystalline region (3) of the base are selectively oxidized, then the etching stop layer (7b), the polycrystalline layer (8) and the thin insulator (7a) are removed by selective etching processes, and thereafter substantially the standard sequence of sub-steps for the production of CMOS circuits is used, wherein with the structuring of the polycrystalline layer (4) both the outer base connection and also the polycrystalline gates of the MOS transistors and optionally the polycrystalline circuit resistors are defined.

17. A process for the production of a bipolar transistor as set forth in one of features 1–5 and features 7 and 9 characterized in that after the etching of windows with an almost vertical slope into the polycrystalline layer (4) prior to removal of the insulator (4a) at the almost vertical slopes polysilicon spacers are produced, thereafter the insulator (4a) is removed and then the procedure is implemented as set forth by features 9–11.

18. A process for the production of a bipolar transistor as set forth in one of features 1–5 and feature 9 characterized in that Si is used as the semiconductor substrate and to produce the monocrystalline base (1) and the polycrystalline region (3) a layer combination of Si/SiGe/Si or Si/SiGeC/Si is deposited, wherein in situ doping with a high boron concentration is effected in a part of the SiGe or SiGeC layer.

19. A process for the production of a bipolar transistor as set forth in one of features 1–5 and features 9 and 18 characterized in that prior to deposition of the SiGe or SiGeC layer stack at the almost vertical slopes of the bipolar window auxiliary spacers comprising a material which can be removed again, preferably comprising an SiO$_2$ or Si$_3$N$_4$ or SiNO layer with a high etching rate are deposited, and that thereafter a preferably anisotropic Si etching operation is effected with an etching depth of preferably 30–150 nm, the auxiliary spacers are removed by a wet-chemical procedure and further operation is as set forth in feature 9.

20. A process for the production of a bipolar transistor as set forth in one of features 1–5 and features 9 and 18 characterized in that prior to deposition of the SiGe or SiGeC layer stack (1) and (3) one or more ion implantation operations are effected for setting the desired collector profile.

21. A process for the production of a bipolar transistor as set forth in one of features 1–5 and features 9 and 20 characterized in that two or more ion implantation cycles are effected, wherein at least one of said implantation cycles is effected without a lacquer mask and between each of those cycles a high-temperature step is effected for healing and dopant activation purposes.

22. A process for the production of a bipolar transistor as set forth in one of features 1–5 and features 10 and 18 characterized in that prior to deposition of the polycrystalline or partially monocrystalline emitter (5) one or more ion implantation operations are effected without a lacquer mask for setting the desired collector profile beneath the active emitter.

23. A process for the production of a bipolar transistor as set forth in one of features 1–5 and features 10 and 22 characterized in that two or more ion implantation cycles are effected, and between each of those cycles a high-temperature step is effected for healing and dopant activation purposes.

The invention in some embodiments is based on the following considerations:

In accordance with the present state of the art, for the purposes of integrating very fast bipolar transistors, in particular SiGe or SiGeC HBTs with an epitaxially deposited base, into an existing CMOS platform, typically 4–5 additional mask levels are required, which in addition for achieving high limit frequencies often require extremely accurate mutual adjustment. Admittedly various transistor constructions are known, but these mostly involve technologically complicated and expensive processes and integration into an existing CMOS platform, as a consequence of the considerable heat budget of the bipolar process, is mostly possible only prior to the temperature-sensitive CMOS processes (for example drain extension and S/D implantation operations). On the other hand, the thermal loading of the HBTs by given heat cycles required for the CMOS technology can also give rise to problems, for example gate oxidation and nitriding at temperatures over 900° C.

The aim of the present invention is to reduce the number of mask levels required for HBT integration to a maximum of 2 and to provide an optimum solution to the problem of mutual interference of the heat budgets of the CMOS process and the bipolar process.

That aim is achieved by the novel device construction and the described production processes provided by the invention.

In accordance with the invention firstly a normal CMOS process implementation, preferably with a p-substrate and an insulated p-well, is carried out without modification, including the most heat-intensive CMOS processes such as healing the well implantations, gate oxidation, gate nitriding and deposition of the gate polylayer. Thereafter, in addition to the CMOS standard procedure, an auxiliary layer stack comprising an insulating layer combination such as $SiO_2$/$Si_3N_4$ or a layer sequence including a conductive layer such as for example $SiO_2$/polysilicon/$Si_3N_4$ is deposited over the gate polylayer, preferably with a CVD process, the thickness of that auxiliary layer stack being comparable to the thickness of the gate polylayer. Windows, referred to hereinafter as bipolar windows, with a very steep slope, are etched by means of a lacquer mask and RIB processes into the existing layer combination including the gate polylayer and then the gate insulator serving as an etching stop layer in the RIB process is removed by a wet-chemical procedure. In that respect the window size and the window position are so selected that the lower window edge almost coincides with the subjacent field oxide or shallow trench boundary of a laterally insulated active region. In a subsequently implemented differential epitaxy procedure (for example Si/SiGeC/Si), a monocrystalline epitaxial base zone is produced in the horizontal region of the window, whereas produced at the almost perpendicular walls of the gate polylayer and the superposed auxiliary layer stack is a polycrystalline perpendicularly arranged base zone of the same conductivity type which on the finished product at the end of the overall process, together with a sub-region of the gate polylayer, forms a highly doped base connection region. In the further course of the procedure, produced at the perpendicularly arranged polycrystalline region of the base are so-called spacers, preferably comprising a layer combination of $SiO_2$/$Si_3N_4$/poly-Si, the thickness of which defines the spacing of the active emitter region from the vertically arranged, polycrystalline part of the base. Then, by means of CVD processes, a preferably in situ-doped polyemitter or partially monocrystalline emitter is deposited and the entire arrangement is planarized by means of a CMP process (chemical/mechanical polishing), the uppermost layer of the auxiliary layer stack deposited on the gate polylayer (preferably $Si_3N_4$) serving as an etching stop. In that respect it is advantageous that the active emitter at the surface is increased in width by double the poly spacer width due to the poly-Si-layer of the spacer-layer combination, which facilitates later contacting of very narrow emitter regions. In the further course of the procedure the auxiliary layer stack is removed, in the case of a pure insulating layer combination that can be effected mask-lessly by plasma etching or wet etching processes. In the case of an $SiO_2$/poly-Si/$Si_3N_4$ auxiliary layer stack, in that respect, in a configuration of the invention, it is possible to use a second lacquer mask for protecting the poly-emitter, with which at the same time the double gates (floating gate and control gate) of non-volatile memory cells are defined. After removal of the auxiliary layer stack the standard CMOS process implementation is continued, wherein, with the structuring of the poly-gates, at the same time the outer base connection regions are structured and wherein doping of the base connection regions and salication of the emitter and base connection regions can be effected jointly with the p+S/D implantation operation and with the salication of the gate and S/D regions. The transistor construction described hereinbefore, with the described production process, in the simplest case requires only one additional lacquer mask, in comparison with the pure CMOS technology.

BRIEF DESCRIPTION OF THE DRAWINGS

The invention is described in greater detail hereinafter by means of an embodiment with reference to the accompanying drawings.

DETAILED DESCRIPTION OF THE INVENTION

Figure 1:
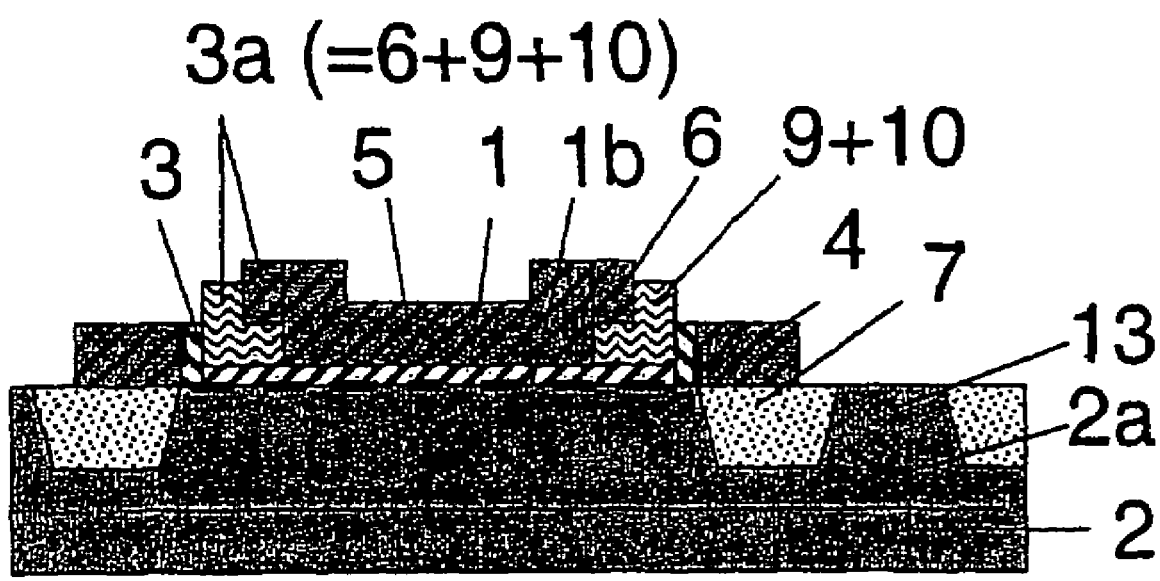
FIG. 1 shows a bipolar transistor according to the invention which is part of a BiCMOS structure.

The production of the bipolar transistor is based on a silicon substrate in which insulating regions (shallow trench, field oxide) 7, n- and p-conducting well regions for MOS transistors (not shown here) produced on the same substrate, and in the regions outside the insulating regions the MOS gate oxide have been produced. The n-well of the MOS transistors is used in the present case as a conducting layer for connecting the collector to the conductor track system 2a.

The heat-intensive process steps of a typical CMOS process, namely well healing and gate oxidation, are already concluded at this juncture.

Firstly a layer stack comprising an initially undoped polycrystalline or amorphous silicon layer (poly-Si) 4, typically between 100 nm and 500 nm, preferably between 200 nm and 300 nm and in particular being 225 nm, an insulating layer 7a, typically $SiO_2$, between 10 nm and 50 nm, preferably between 15 nm and 25 nm and in particular being 20 nm, a further polycrystalline or amorphous silicon layer 8, being typically between 50 and 300 nm, preferably between 100 nm and 200 nm and in particular being 120 nm, and a further insulating layer 7b, typically $Si_3N_4$, between 20 and 200 nm, preferably between 40 nm and 100 nm and in particular being 60 nm, is applied to the substrate over the entire area.

Alternatively at this point the layers 7a and 8 could be replaced by a single insulating layer of the same layer thickness as the total thickness of 7a and 8, in which case that insulating layer, preferably $SiO_2$, is to be removed by a wet-chemical process selectively to form the spacers which are later produced.

In the production of a floating gate memory cell the layer stack is enlarged by a further insulating layer 11, preferably $SiO_2$, between 8 and 7b.

Figure 2:
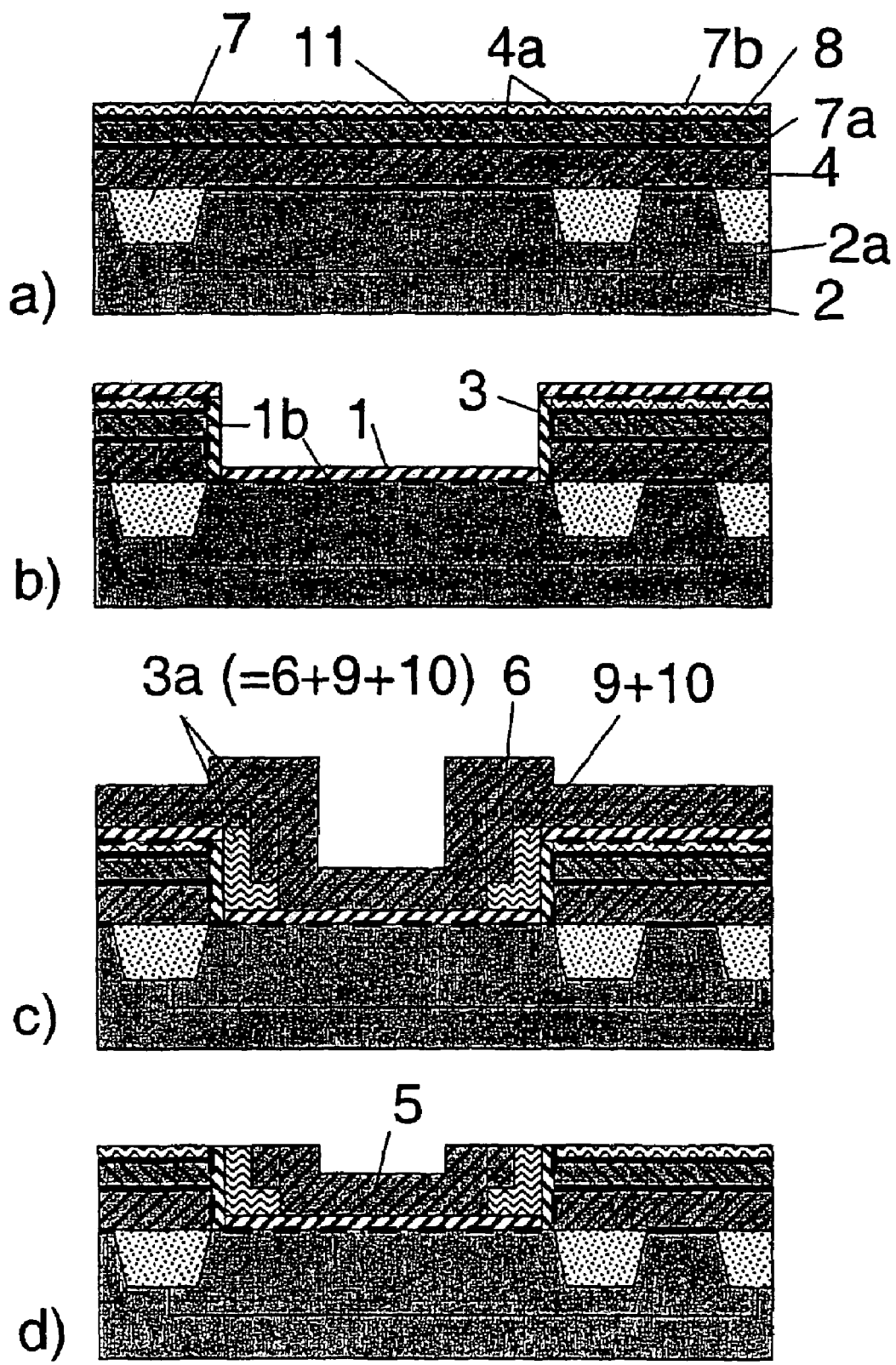
FIGS. 2a–2d show the BiCMOS structure according to the invention at various stages in production.

At this juncture the condition is as shown in FIG. 2a.

The first poly-Si layer 4 serves as a later highly doped or metallically conducting connection of the base to the conductor track system and at another location as a gate for MOS transistors.

The first insulating layer 7a serves as an etching stop layer in the later removal of the superposed poly-Si 4 in an RIE etching process.

The second poly-Si 8 serves to achieve a sufficient step height for the later spacer production.

The second insulating layer 7b serves as a stop layer of a later CMP process step in which poly-Si layers which are still disposed thereover are planarized and removed.

A window (hereinafter referred to as a bipolar window) with a slope which is as steep as possible is etched into the layer stack in the region of the later emitter, defined by a lacquer mask, by means of an anisotropic RIE process, in which respect the gate oxide which is present on the substrate regions outside the insulating regions 7 as the lowermost layer can be used as a stop layer.

Now, an implantation operation for doping of the collector region can be effected, masked by the bipolar window.

After the bottom of the bipolar window has been freed of the insulating gate oxide layer by wet-chemical etching, typically in HF, the monocrystalline base 1 of the transistor and the polycrystalline base connection 3 are produced in a deposition process (differential or selective epitaxy). The procedure involved results in conducting connections to the collector 2a and to the first poly-Si layer 4.

Prior to the actual deposition of the base a buffer layer 1b can be deposited as a seed layer.

At this point the condition as shown in FIG. 2b is reached.

To produce the spacers for setting the lateral spacing of the later emitter 5 relative to the base connection region 3, firstly a layer stack comprising one or more insulating layers 9+10, in the present case a TEOS layer 9, typically 30 nm, and a silicon nitride layer 10, typically 140 nm, and a conducting polycrystalline or amorphous silicon layer 6, typically 120 nm, is deposited in the CVD process over the entire area.

Those layers are etched back without masking in an anisotropic plasma etching process so that the spacers 3a remain only at the perpendicular edges of the bipolar window. In the present case etching is implemented by a dry chemical process as far as the lowermost insulating layer 9 (TEOS). The TEOS layer 9 is then etched by a wet-chemical process, typically in HF.

At this point a further implantation operation can be carried out for doping the collector region.

Now doped polycrystalline or amorphous silicon is deposited over the entire area, later forming the emitter 5, typically 160 nm.

That condition is shown in FIG. 2c.

By means of a chemical-mechanical polishing process (CMP) the layers outside the emitter region are removed to the second insulating layer 7b so that the doped poly-Si layer 5 only remains in the bipolar window.

That condition is shown in FIG. 2d.

The insulating layer 7b can now be removed in a wet-chemical etching process.

The emitter is now covered by a second lacquer mask and the poly-Si layer 8 is removed in an RIE process (except at the locations at which a floating gate memory cell is possibly to be produced).

In the situation where, instead of the layers 7a and 8, a single insulating layer was used, which in a wet-chemical etching process can be selectively removed to afford the spacers and the exposed poly-Si layer, no second lacquer mask is required at that location.

The following process steps are now identical to those which are necessary in a typical CMOS process for the sole production of MOS transistors.

With the lacquer mask which is used for structuring the MOS gates, the outer base connection 4 is structured at the same time. That takes place in an RIE process. In that process step the collector connection region 13 is exposed at the same time.

By way of a further lacquer mask which is used in relation to the MOS transistors for defining the p-conducting source and drain connection regions, the polycrystalline silicon of the base connection (regions 3 and 4) is doped by means of ion implantation.

That implantation is healed and activated by tempering. That is implemented in the same process step as healing and activating the MOS source and drain implantations.

That condition is shown in FIG. 1.

A silication process provides for the formation of a silicide 12, typically $CoSi_2$, for reducing the electrical resistance, on the emitter, the collector connection region and the base connection region 4 together with the source and drain regions and the poly-Si gate of the MOS transistors.

Finally, contacting is effected by way of the conductor track system.

Figure 3:
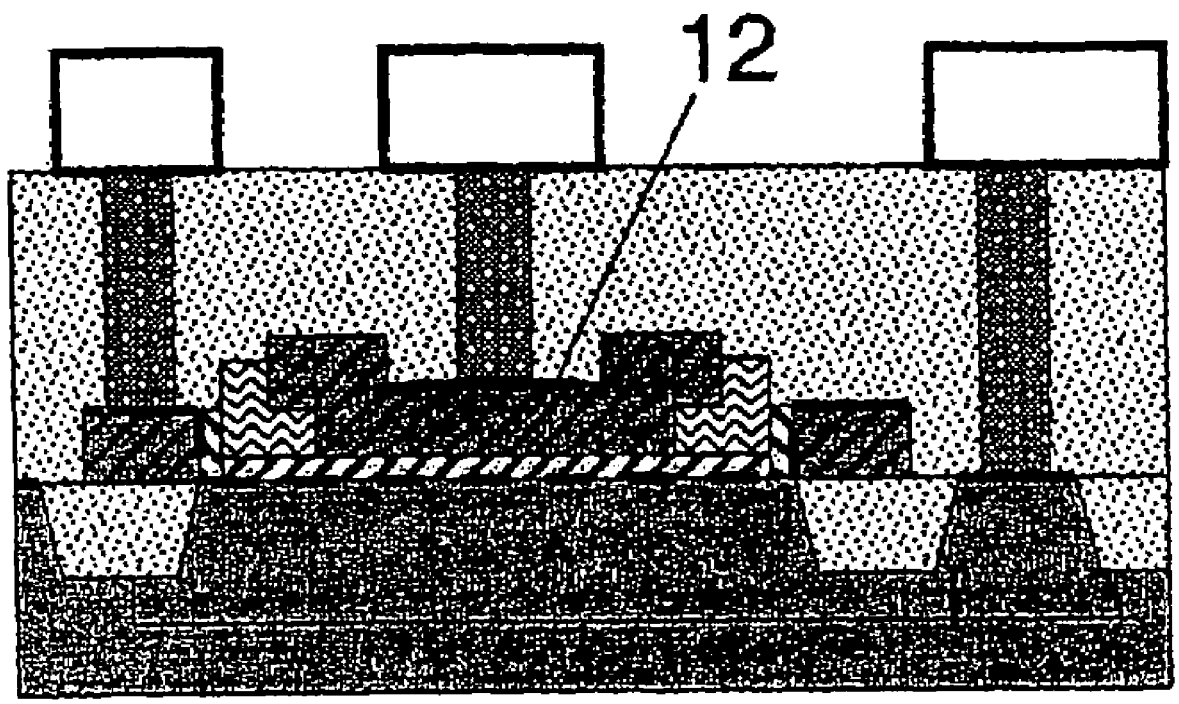
FIG. 3 shows a BiCMOS structure produced with the process according to the invention.

That condition is shown in FIG. 3.

The invention claimed is:

1. A bipolar transistor having a base and self-positioned active emitter, characterized in that the base is formed from a first substantially monocrystalline epitaxial region (1) which is arranged in parallel relationship to the surface of the semiconductor substrate (2) and a second substantially polycrystalline and highly doped region (3) of the same conductivity type which is arranged in perpendicular relationship to the substrate surface and encloses the first region at all sides and that said second region, at least at one side, is conductingly connected to a third high temperature-resistant polycrystalline layer (4) which is arranged in parallel relationship to the surface of the semiconductor substrate and forms or includes the outer base contact to a metallic conductor track system, and further characterized in that between the self-positioned active emitter (5) and the highly doped polycrystalline region (3) arranged in perpendicular relationship to the surface of the semiconductor substrate (2) is spacing defined by a spacer (3a) arranged at the perpendicular region and comprising one or more insulating layers (9, 10) and at least one high temperature-resistant, good-conducting polycrystalline layer (6), wherein the latter is conductingly connected to the active emitter.

2. A bipolar transistor with epitaxially grown base and self-positioned emitter as set forth in claim 1 characterized in that the one or more layers of the spacer (3a) are deposited by a CVD process.

3. A bipolar transistor with epitaxially grown base and self-positioned emitter as set forth in claim 1 characterized in that the monocrystalline epitaxial region (1) of the base is delimited laterally, on at least three sides, by an insulating region (7), for example a shallow trench or field oxide.

4. A bipolar transistor with epitaxially grown base and self-positioned emitter as in claim 1, wherein the one or more insulating layers (9, 10) are formed in an L-shape.

5. A bipolar transistor, in particular for use in a BiCMOS structure, which includes an emitter (5) and a base (1, 3), wherein the base includes a monocrystalline base region (1) and a polycrystalline base region (3), characterized in that the emitter (5) is laterally surrounded at least partially by a base contact layer (4) which is laterally separated from the emitter (5) by at least one spacer (3a), and the polycrystalline base region (3) is disposed between the at least one spacer (3a) and the base contact region (4) and further characterized in that the at least one spacer (3a) includes one or more insulating layers (9, 10) and a conductive spacer layer (6) arranged between the emitter (5) and the one or more insulating layers (9, 10) in such a way that the spacer layer (6) is electrically conductingly connected to the emitter (5).

6. A BiCMOS structure including a bipolar transistor as set forth in claim 5.

7. A bipolar transistor as in claim 5, wherein the one or more insulating layers (9, 10) are formed in an L-shape.

* * * * *

UNITED STATES PATENT AND TRADEMARK OFFICE
CERTIFICATE OF CORRECTION

| | | |
|---|---|---|
| PATENT NO. | : 7,307,336 B2 | Page 1 of 1 |
| APPLICATION NO. | : 10/497827 | |
| DATED | : December 11, 2007 | |
| INVENTOR(S) | : Ehwald et al. | |

It is certified that error appears in the above-identified patent and that said Letters Patent is hereby corrected as shown below:

Column 7, line 45, "RIB" should be --RIE--.

Column 7, line 47, "RIB" should be --RIE--.

Column 7, line 65, "$SiO_2Si_3N_4$" should read --$SiO_2/Si_3N_4$--.

Signed and Sealed this

Twentieth Day of May, 2008

JON W. DUDAS
*Director of the United States Patent and Trademark Office*